United States Patent
Marty et al.

[11] Patent Number: 6,136,640
[45] Date of Patent: Oct. 24, 2000

[54] PROCESS FOR FABRICATING A METAL-METAL CAPACITOR WITHIN AN INTEGRATED CIRCUIT, AND CORRESPONDING INTEGRATED CIRCUIT

[75] Inventors: Michel Marty, Varces; Harvé Jaouen, Meylan, both of France

[73] Assignee: STMicroelectronics S.A., Gentilly, France

[21] Appl. No.: 09/118,499

[22] Filed: Jul. 17, 1998

[30] Foreign Application Priority Data

Jul. 18, 1997 [FR] France ................................. 97 09164

[51] Int. Cl.⁷ ...................... H01L 21/8242; H01L 21/20; H01L 27/108
[52] U.S. Cl. .......................... 438/239; 438/250; 438/386; 438/393; 257/301
[58] Field of Search ..................... 438/239, 250, 438/243, 391, 397, 393, 386, 396; 257/301, 303, 304

[56] References Cited

U.S. PATENT DOCUMENTS

| | | | |
|---|---|---|---|
| 5,789,303 | 8/1998 | Leung et al. | 438/381 |
| 5,918,135 | 6/1999 | Lee et al. | 438/393 |
| 6,008,083 | 12/1999 | Brabazon et al. | 438/239 |

FOREIGN PATENT DOCUMENTS 5-129522  5/1993  Japan .

*Primary Examiner*—Matthew Smith
*Assistant Examiner*—Lex H Malsawma
*Attorney, Agent, or Firm*—Theodore E. Galanthay; Stephen C. Bongini; Fleit, Kain, Gibbons, Gutman & Bonigini P.L.

[57] ABSTRACT

A process for fabricating a metal-metal capacitor within an integrated circuit comprises the steps of: producing a first metal electrode, a second metal electrode, and a dielectric layer on top of a lower insulating layer; and depositing an upper insulating layer on top of the two metal electrodes and the dielectric layer. The integrated circuit comprises the lower insulating layer, a first metal layer which is on top of the lower insulating layer, and the upper insulating layer which is on top of the first metal layer. The capacitor comprises the first metal electrode, the second metal electrode, and the dielectric layer wherein each of the two metal electrodes is in contact with one side of the dielectric layer. The electrodes and the dielectric layer lie between the lower insulating layer, which supports a level of metallization (M1), and the upper insulating layer which covers this level of metallization.

14 Claims, 10 Drawing Sheets

PROCESS FOR FABRICATING A METAL-METAL CAPACITOR WITHIN AN INTEGRATED CIRCUIT, AND CORRESPONDING INTEGRATED CIRCUIT

CROSS-REFERENCE TO RELATED APPLICATIONS

This application is based upon and claims the benefit of the priority of the prior French patent application 97-09164 filed on Jul. 18, 1997, the contents of which are incorporated herein.

BACKGROUND OF THE INVENTION

1. Field of the Invention

The invention relates generally to capacitors and more particularly to metal-metal capacitors produced within an integrated circuit, and their fabrication process.

2. Description of the Related Art

Among the various types of capacitors which may appear within an integrated circuit produced on a semiconductor chip, for example a silicon chip, mention may be made of so-called "polysilicon-silicon" capacitors or "polysilicon-polysilicon" capacitors or else "metal-metal" capacitors, depending on the composition of their electrodes.

So-called "metal-metal" capacitors, i.e. capacitors whose two electrodes are made of metal, offer the advantage of having a very small variation in the capacitance as a function of the voltage which is applied to them, and of furthermore having a very low parasitic resistive component. For all these reasons, metal-metal capacitors are advantageously used in radiofrequency applications.

An integrated circuit generally comprises electronic components, for example transistors, produced within a semiconductor substrate, as well as various levels of metallization which in particular allow a formation of interconnection tracks between the various components of the integrated circuit. Each level of metallization then generally comprises, after etching a metal layer, several interconnection tracks lying at this same level, all these tracks being sandwiched between two insulating layers. The level of metallization immediately above is then produced on the upper insulating layer covering the lower level of metallization. The interconnection between tracks lying at two adjacent levels of metallization is formed by interconnection holes filled with a filling metal, for example tungsten, and referred to by those skilled in the art as vias. Moreover, an intermetal diffusion barrier is produced at the aluminium-tungsten interface by depositing a protective layer generally made of titanium nitride or of titanium.

The conventional thickness of an insulating layer separating two adjacent levels of metallization is generally about 1 micron. It is therefore not possible to produce a metal-metal capacitor directly between two track portions lying at two different levels of metallization separated by such a thickness. This is because the thickness of the dielectric layer of a metal-metal capacitor must typically be about 200 Å.

Thus, a known process for fabricating a metal-metal capacitor within an integrated circuit consists in depositing, on the lower insulating layer for supporting a level of metallization, covered with a protective layer, for example made of titanium nitride, a layer of aluminium forming a level of metallization (this protective layer resulting from the presence at another point in the integrated circuit of a via connecting this level of metallization to a lower level of metallization or to a component produced in the substrate). Next, this layer of aluminium is etched so as to define, for instance, the first electrode of the capacitor and then the upper insulating layer is deposited on this first electrode and on all the interconnection tracks of the level of metallization, this upper insulating layer covering this level of metallization and being intended to support the level of metallization immediately above. An aperture is then etched in this upper insulating layer down to above the first electrode of the capacitor and then a thin layer of a dielectric, for example generally silicon dioxide or possibly silicon nitride, is deposited to a thickness of approximately 50 to 300 Å. Another protective layer is then deposited on this dielectric layer, allowing contact between this level of metallization and another via at another point in the integrated circuit. The said aperture is then filled with the filling metal, typically tungsten, by deposition and then planarization. After having deposited an intermetal diffusion barrier on the tungsten, the metal layer (aluminium) of the level of metallization immediately above is deposited, which layer is etched so as to form the interconnection tracks of this level of metallization, and the second electrode of the metal-metal capacitor is deposited.

Such a process has drawbacks.

This is because it does not allow precise control of the thickness of the dielectric of the capacitor thus produced, in particular when this dielectric is composed of silicon dioxide, since the TiN protective layer attacks the dielectric of the capacitor. Furthermore, in general this process only allows the production of planar metal-metal capacitors. Moreover, the capacitor thus produced extends over two levels of metallization of the integrated circuit.

The invention is intended to provide a solution to these problems.

SUMMARY OF THE INVENTION

Briefly, in accordance with one aspect of the invention, a process for fabricating a metal-metal capacitor within an integrated circuit comprises the steps of: producing a first metal electrode, a second metal electrode, and a dielectric layer on top of a lower insulating layer; and depositing an upper insulating layer on top of the two metal electrodes and the dielectric layer. The integrated circuit comprises the lower insulating layer, a first metal layer which is on top of the lower insulating layer, and the upper insulating layer which is on top of the first metal layer. The capacitor comprises the first metal electrode, the second metal electrode, and the dielectric layer wherein each of the two metal electrodes is in contact with one side of the dielectric layer. Briefly, in accordance with another aspect of the invention, a computer readable medium for fabricating the metal-metal capacitor within the integrated circuit comprises program instructions for implementing each of the above steps.

Briefly, in accordance with another aspect of the invention, an integrated circuit comprises a lower insulating layer; a first metal layer which is on top of the lower insulating layer; an upper insulating layer which is on top of the first metal layer; and a metal-metal capacitor. The capacitor comprises a first metal electrode; a second metal electrode; and a dielectric layer. The first and second metal electrodes are placed one on each side of and in contact with the dielectric layer, and the first and second metal electrodes and the dielectric layer lie between the lower insulating layer and the upper insulating layer.

DETAILED DESCRIPTION OF AN EMBODIMENT

1. Introduction and Overview

Figure 1:
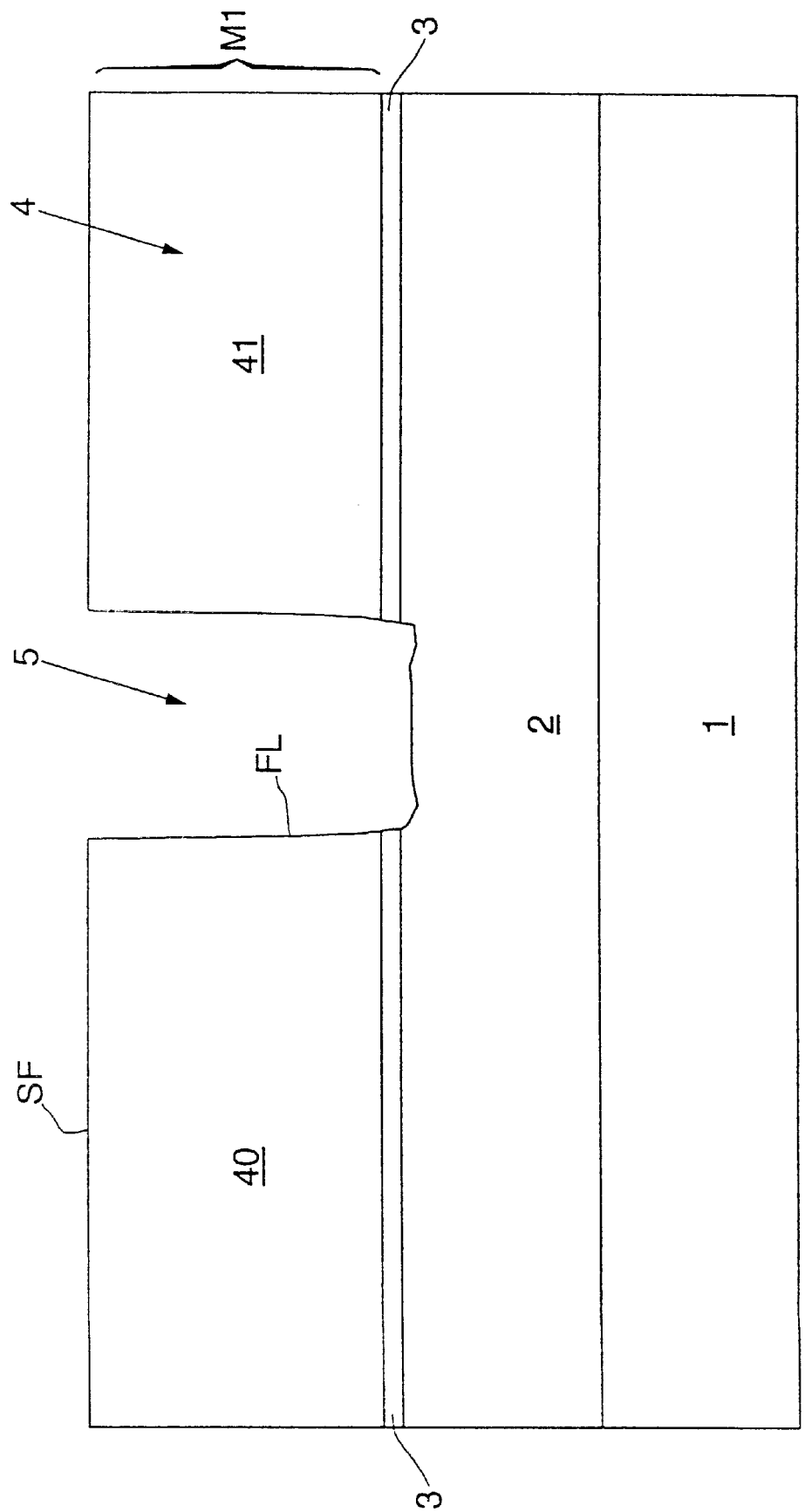
FIG. 1 is a cross-section of an integrated circuit showing the fabrication through the first metallization level according to the present invention.
Figure 2:
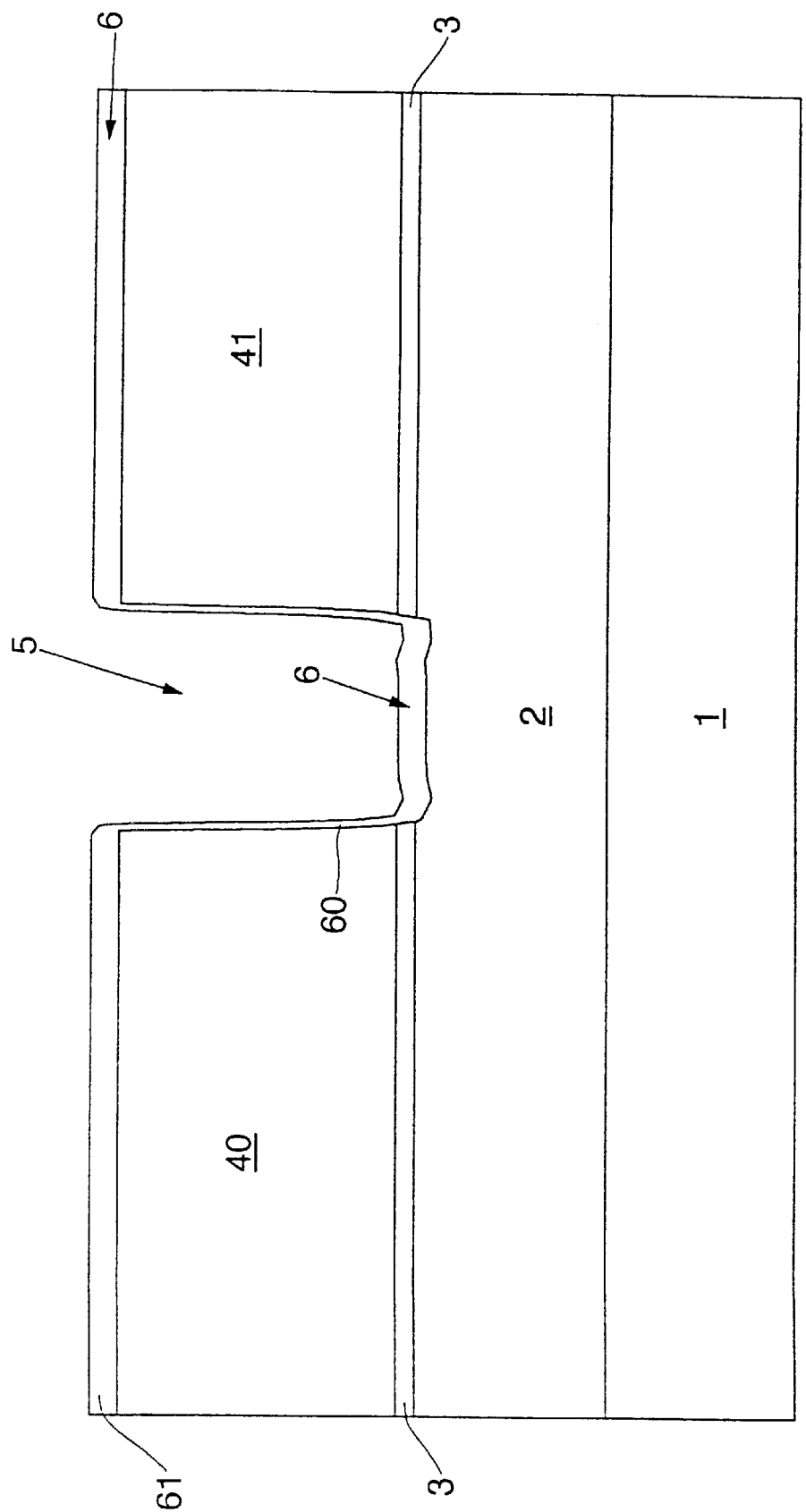
FIG. 2 is a cross-section of an integrated circuit showing the fabrication through the dielectric layer according to the present invention.
Figure 3:
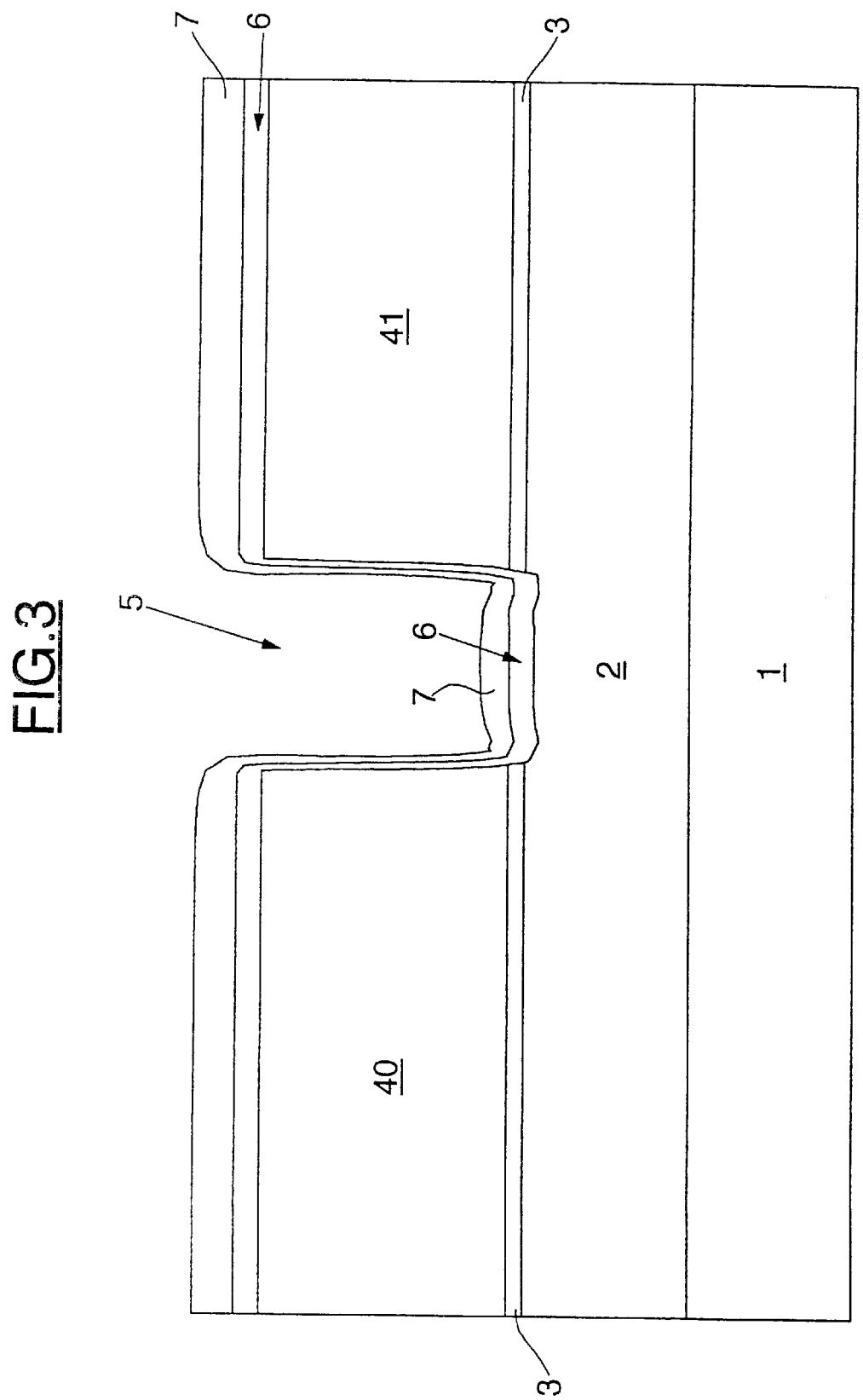
FIG. 3 is a cross-section of an integrated circuit showing the fabrication through the metal layer from which the second metal electrode will be formed according to the present invention.
Figure 4:
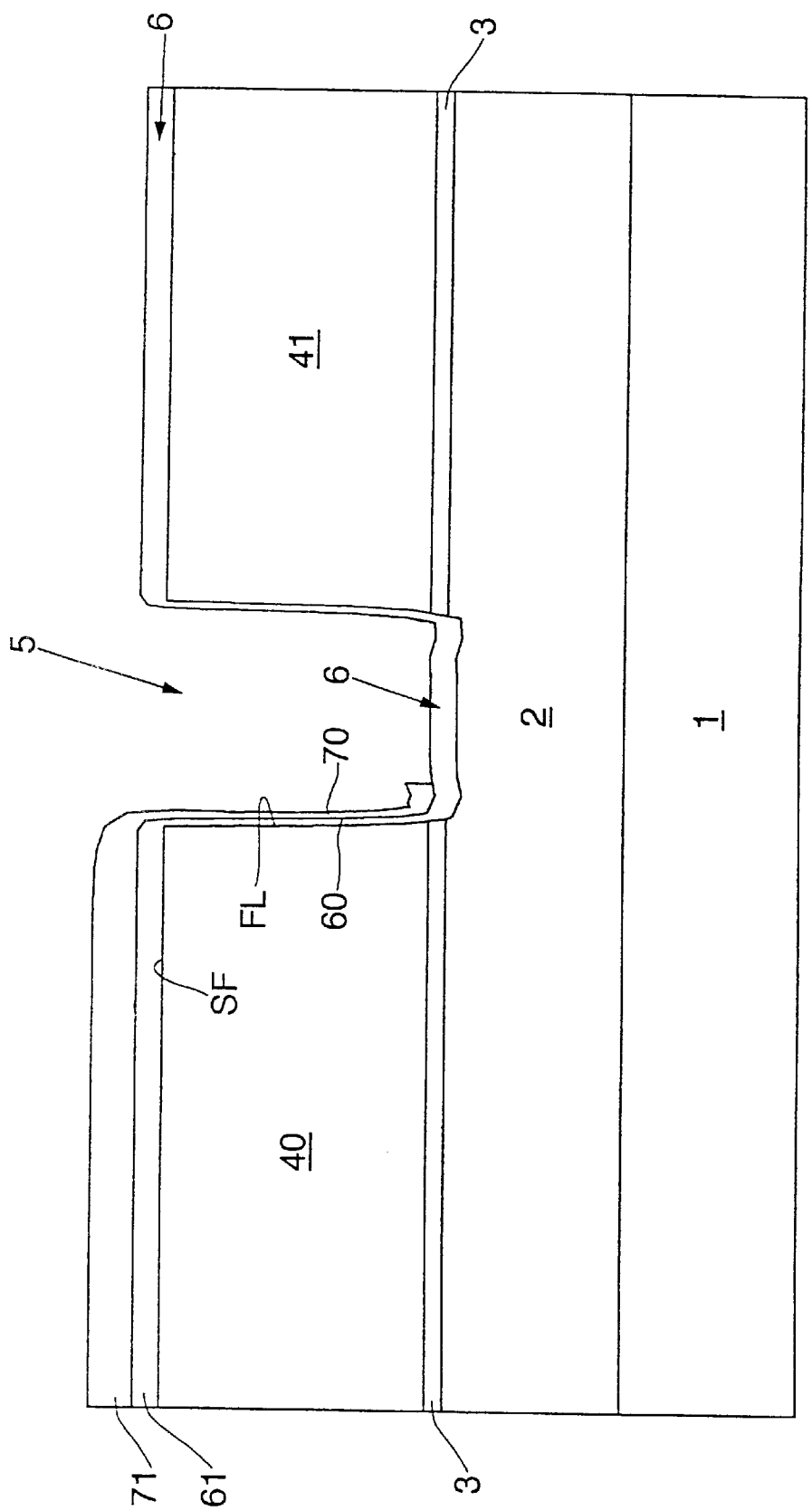
FIG. 4 is a cross-section of an integrated circuit showing the fabrication through the formation of the second metal electrode according to the present invention.
Figure 5:
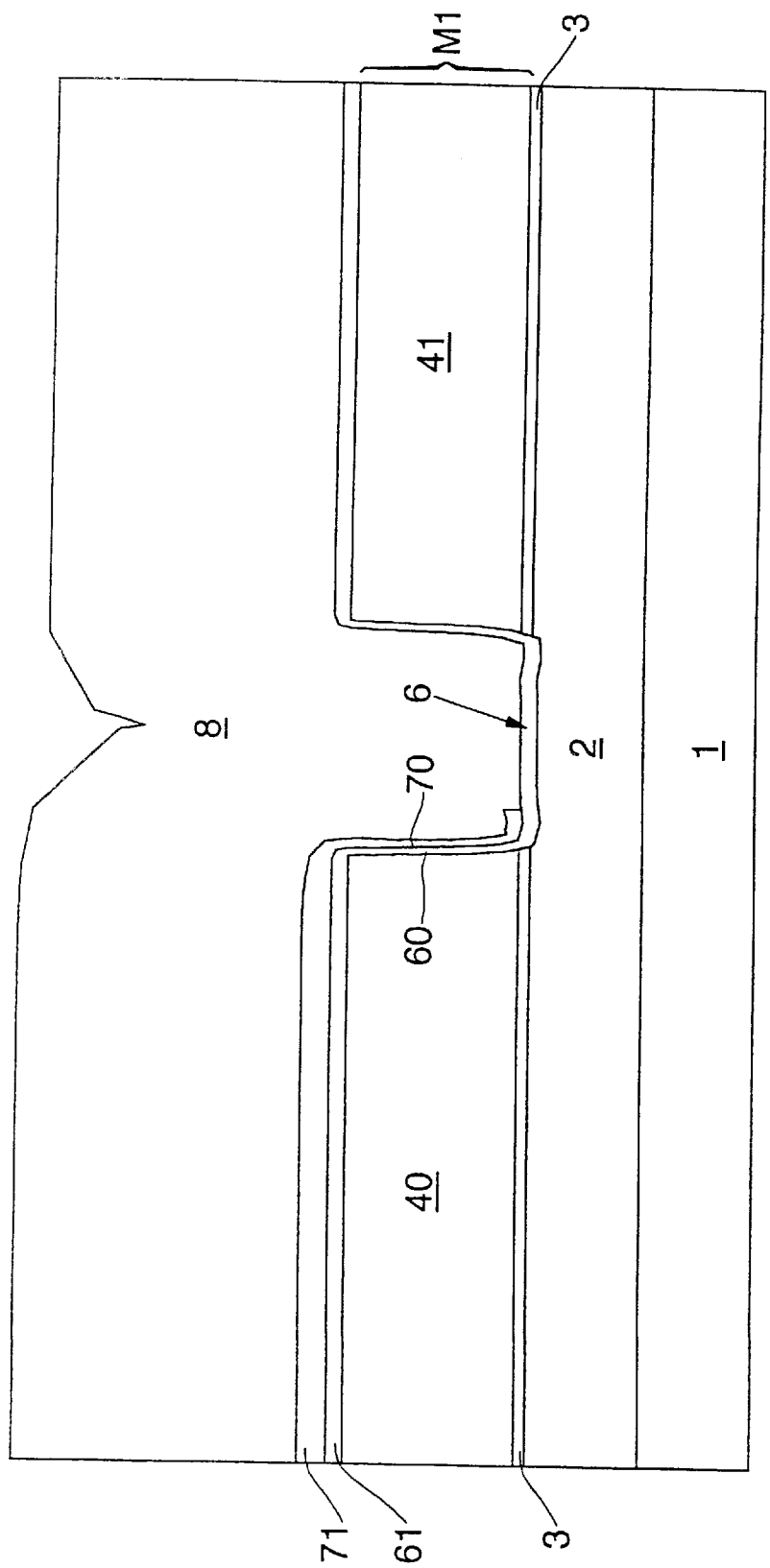
FIG. 5 is a cross-section of an integrated circuit showing the fabrication through the deposit of an insulating layer on top of the second metal electrode according to the present invention.

One object of the invention is to be able to produce capacitors which are not necessarily planar.

Another object of the invention is to provide a process for fabricating a metal-metal capacitor which allows better control of the thickness of the dielectric, especially when this is composed of $SiO_2$.

The invention therefore provides a process for fabricating a metal-metal capacitor within an integrated circuit, this capacitor comprising two metal electrodes in contact with a thin dielectric layer on each side of the latter.

According to the invention, the two metal electrodes and the dielectric layer of the said capacitor are produced above the lower insulating layer which supports a level of metallization of the integrated circuit, before depositing the upper insulating layer which covers the said level of metallization.

In other words, the invention is noteworthy in the sense that it allows a metal-metal capacitor to be produced on virtually one level of metallization, while the prior art entails two levels of metallization.

According to one advantageous method of implementing the process according to the invention, a first metal layer forming the said level of metallization of the integrated circuit is produced on top of the lower insulating layer and the said first metal layer is etched so as to form a first electrode of the capacitor. When a conventional material, such as aluminium, is used for the interconnection tracks and the metal electrodes of the capacitor, the first metal layer is generally deposited on a protective layer, typically made of titanium nitride, which covers the lower insulating layer, typically made of $SiO_2$. This protective layer generally results from the necessity of having to deposit at another point in the integrated circuit a diffusion barrier between a tungsten via and this first metal layer.

The thin layer of a dielectric material, generally silicon dioxide ($SiO_2$), is then deposited on the first metal layer thus etched and then a second metal layer, for example of aluminium or tungsten, thinner than the first, is deposited on the dielectric layer. This second metal layer is etched in order to form the second electrode of the capacitor and the said upper insulating layer is deposited on the second metal layer thus etched. In practice, this upper insulating layer will advantageously be the insulating layer for supporting the level of metallization immediately above.

Thus, according to this method of implementation, a protective layer of titanium nitride in contact with the dielectric material is no longer used.

Moreover, according to a preferred method of implementing the invention, at least one side wall for the said first electrode is made during etching of the first metal layer and, after the dielectric layer has been deposited on the side wall, the second metal layer deposited on the dielectric layer is etched so as to form, for the second electrode, a side portion which is in contact with the dielectric layer and faces the said side wall.

In other words, the invention makes it possible here to produce non-planar capacitors, i.e. having in this case a vertical side wall, thereby making it possible in particular to increase the area of the capacitor while still controlling the mechanical stresses.

When it is desired to connect the second electrode of the capacitor to the upper level of metallization, for example in order to connect it to another component, an aperture is etched in the upper insulating layer, which is filled with a filling metal so as to form a metal interconnection hole or via, and a third metal layer, corresponding to an upper level of metallization, is produced on the said upper insulating layer and in electrical contact with the metal interconnection hole.

The subject of the invention is also an integrated circuit which includes a metal-metal capacitor having two metal electrodes placed on each side of and in contact with a thin dielectric layer.

According to a general characteristic of the invention, the two metal electrodes and the dielectric layer lie between the lower insulating layer which supports a level of metallization of the integrated circuit and the upper insulating layer which covers this level of metallization.

Advantageously, the first electrode is part of the metal layer forming the said level of metallization and the second electrode is thinner than the first electrode.

According to a preferred embodiment of the invention, the first electrode has a side wall covered with a part of the dielectric layer, this part being covered with a part of the second electrode. The capacitor according to the invention is therefore not necessarily planar.

Other advantages and features of the invention will appear on examining the detailed description of embodiments and methods of implementation, these being in no way limiting, and of the appended drawings in which:

FIGS. 1 to 10 illustrate very diagrammatically the various steps in one method of implementing the process according to the invention, allowing formation of a metal-metal capacitor according to the invention.

2. Process Description

In FIG. 1, the reference number 1 denotes a semiconductor, for example silicon, substrate. On top of this substrate is a lower insulating layer 2 which is intended, as will be seen below, to support the level of metallization M1 of the integrated circuit, this being assumed, in the example described, to be the first level of metallization. This insulating layer, for example of silicon dioxide, may be produced by a thermally assisted deposition (TEOS deposition) at low temperature, typically below 400° C. The thickness of this lower insulating layer is conventionally about 1 micron.

A protective layer 3, generally based on titanium or titanium nitride, is deposited to a thickness of 500 to 1000 Å on this lower insulating layer 2. This layer 3 results from the presence, at another point in the integrated circuit, of a via intended, for example, to connect a component produced in the substrate 1 with the level of metallization M1 supported by the insulating layer 2. The function of this layer 3 is to form an intermetal diffusion barrier between the metal of the via (tungsten) and that of the level of metallization M1 (aluminium).

The first metal layer 4 deposited is intended, after etching, for example plasma dry etching, to form, in particular, the various interconnection tracks of the integrated circuit lying at the first level of metallization M1. The etching mask used, apart from forming these interconnection tracks by etching, is used to form the first metal electrode 40 of the future metal-metal capacitor in the first metal layer 4. This first electrode 40 has a planar upper surface SF and is separated from the rest 41 of the first metal layer 4 by an aperture 5 which extends as far as the level of the lower insulating layer 2 and provides, for the first metal electrode 40, a substantially vertical side wall FL. The thickness of this first metal layer is typically about 0.6 microns.

The next step (FIG. 2) consists in depositing, on the stack of layers in FIG. 1, a thin layer 6 formed from a material having dielectric properties, generally silicon dioxide ($SiO_2$) or alternatively, for example, silicon nitride ($SiN_4$) or tantalum oxide ($Ta_2O_5$). As will be seen in more detail below, the material of this layer is intended to form the dielectric of the metal-metal capacitor. The thickness of this layer 6 is typically about 0.02 microns, in particular in its planar portion 61 lying on the metal electrode 40. On the other hand, the vertical portion 60 of this dielectric layer, lying on the vertical side wall of the first electrode, may have a thickness slightly less than the planar portion 61.

Next (FIG. 3), a second metal layer 7 is deposited, this having a smaller thickness than the first metal layer 4, typically about 0.1 microns. This second metal layer, for example also of aluminium or of tungsten, will allow the second metal electrode of the metal-metal capacitor to be formed.

After the second layer of metal has been etched, for example by plasma dry etching, the second metal electrode of the capacitor is defined (FIG. 4), this having a substantially planar part 71 opposite the planar surface SF of the first electrode 40 and (if it is desired to form a non-planar capacitor) a vertical part 70 which covers the vertical portion 60 of dielectric and lies facing the vertical side wall FL of the first metal electrode 40.

Figure 6:
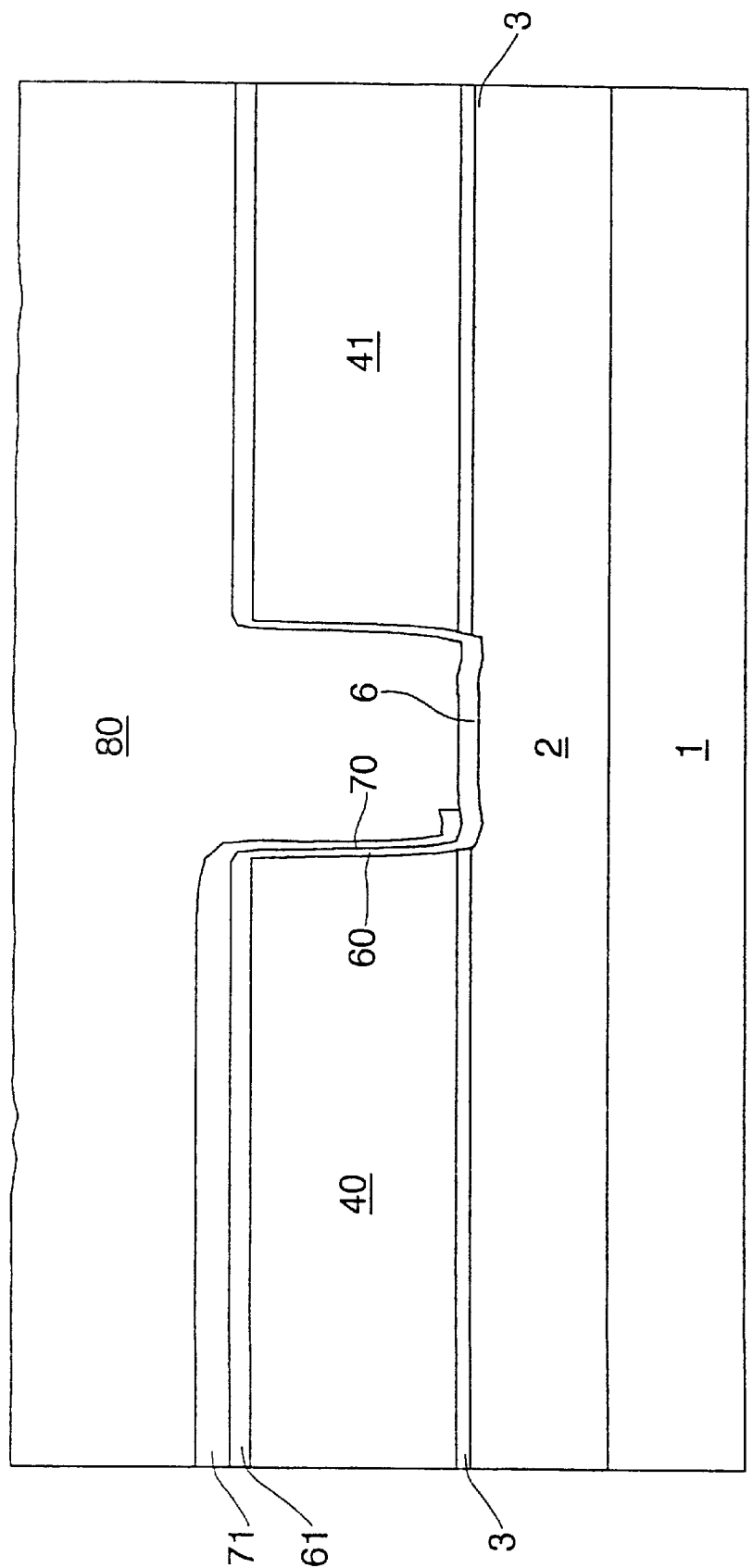
FIG. 6 is a cross-section of an integrated circuit showing the fabrication through the upper insulating layer according to the present invention.
Figure 7:
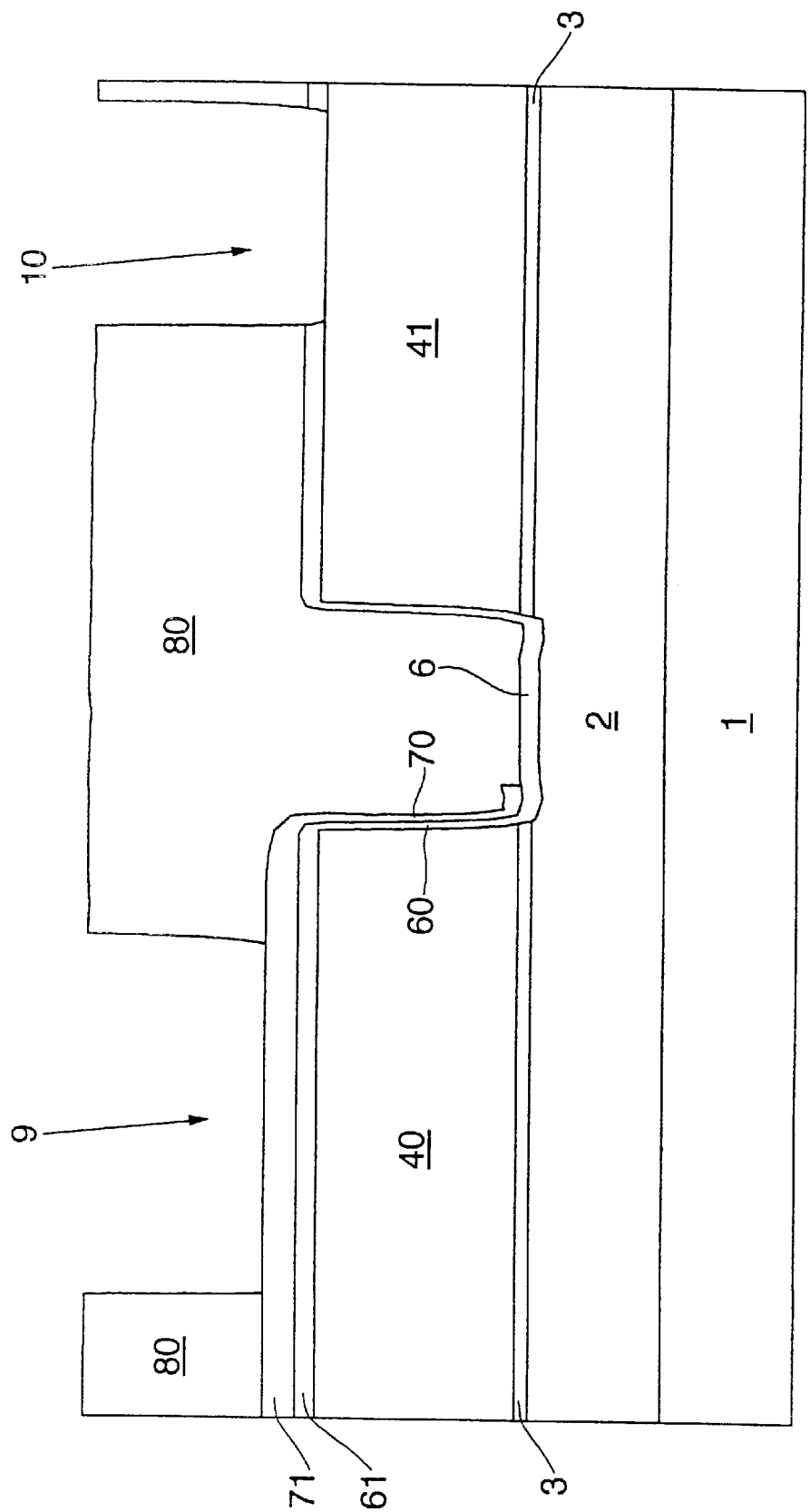
FIG. 7 is a cross-section of an integrated circuit showing the fabrication through the etching of two apertures in the upper insulating layer according to the present invention.
Figure 8:
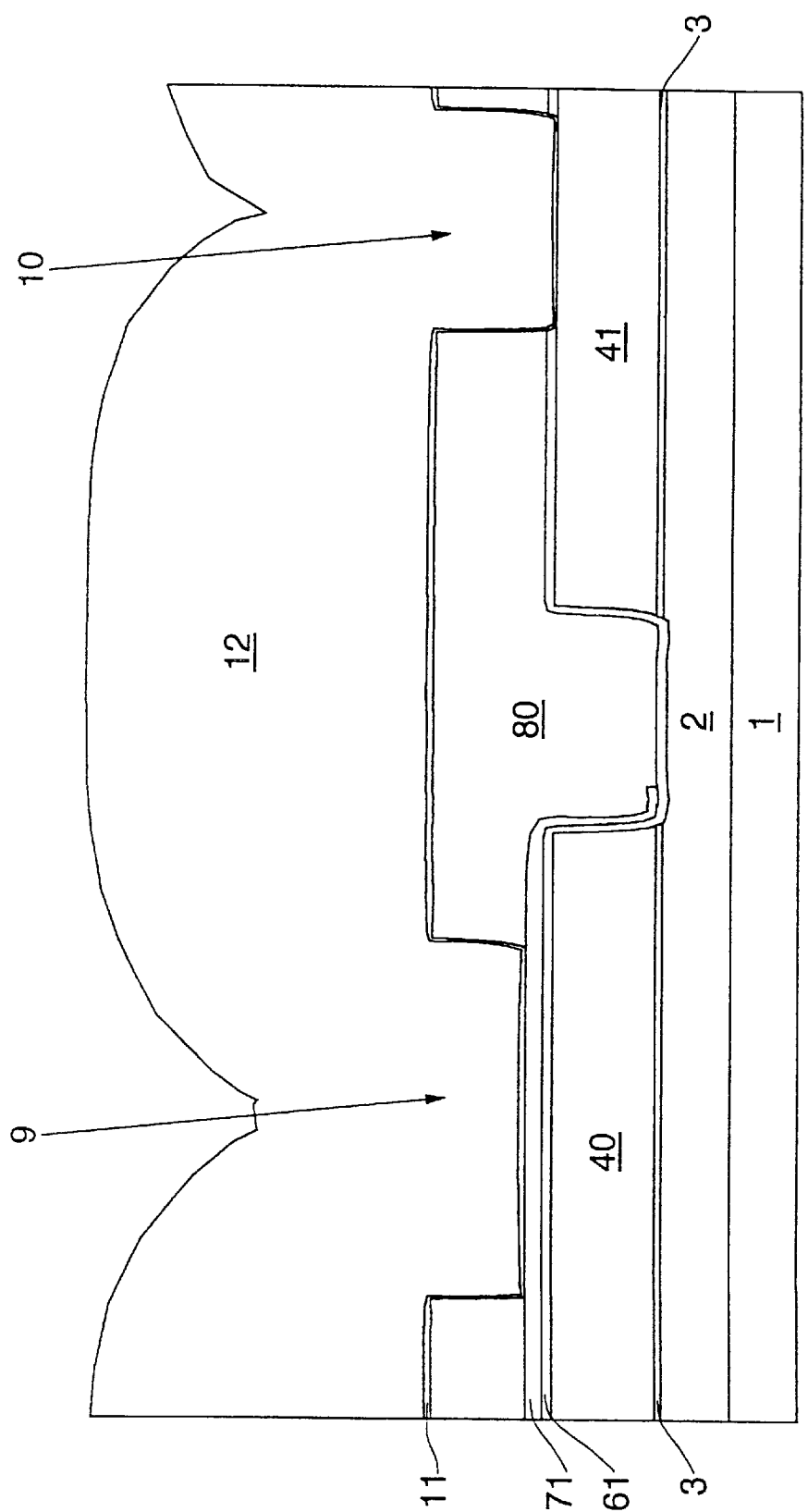
FIG. 8 is a cross-section of an integrated circuit showing the fabrication through the deposit of a filling material according to the present invention.

Next (FIG. 5), the whole assembly is covered with an insulating layer 8, for example of silicon dioxide, which may also be deposited by TEOS deposition. After polishing, for example mechanochemically, the upper insulating layer 80, having a typical thickness of about 0.7 microns, is obtained (FIG. 6).

The invention is distinguished from the prior art in particular by the fact that the electrodes of the capacitor are defined, not as in the prior art by etching an insulating layer and then depositing a dielectric covered by a protective layer of titanium nitride which is itself covered by a filling metal and then by aluminium, but by directly etching the metal layer of a level of metallization. A specific thin level of metallization is deposited on the dielectric in order to form the second electrode. Moreover, this specific level of metallization is not intended to form tracks capable of being connected by vias to the level of metallization immediately below. It therefore follows that deposition of a protective layer of titanium nitride on the dielectric is no longer necessary. This allows the thickness of the dielectric to be perfectly controlled, solely by the deposition operation, in particular when the dielectric is silicon dioxide. This is because, in this case, the drawback arising from depositing titanium nitride, which is a reducing agent for silica, is eliminated.

Moreover, the invention can be used to obtain metal-metal capacitors which are not necessarily planar but may have side walls. This allows the surface area of the capacitors to be increased, without correspondingly increasing the overall surface area of the integrated circuit.

Finally, those skilled in the art will note that, according to the invention, the metal-metal capacitor obtained is formed virtually within one and the same level of metallization M1, between the two insulating layers flanking this level of metallization, while in the prior art the metal-metal capacitor extends over two levels of metallization.

In order to connect the second metal electrode 71 of the metal-metal capacitor to an upper level of metallization of the integrated circuit, the steps as illustrated more particularly in FIGS. 7 to 10 are then carried out.

More specifically, an aperture 9 is etched in the upper insulating layer 80 down to the second metal electrode 71 of the capacitor. If it is also desired to connect the rest 41 of the first metal layer of the level of metallization M1 to the level of metallization M2 immediately above, an aperture 10 is also etched, down to this part 41.

Next (FIG. 8), a thin protective layer 11, also formed from titanium or titanium nitride and typically having a thickness of about 0.1 microns, is deposited on the etched upper insulating layer 80. A filling material 12, for example tungsten, is then deposited on the whole assembly thus formed.

Figure 9:
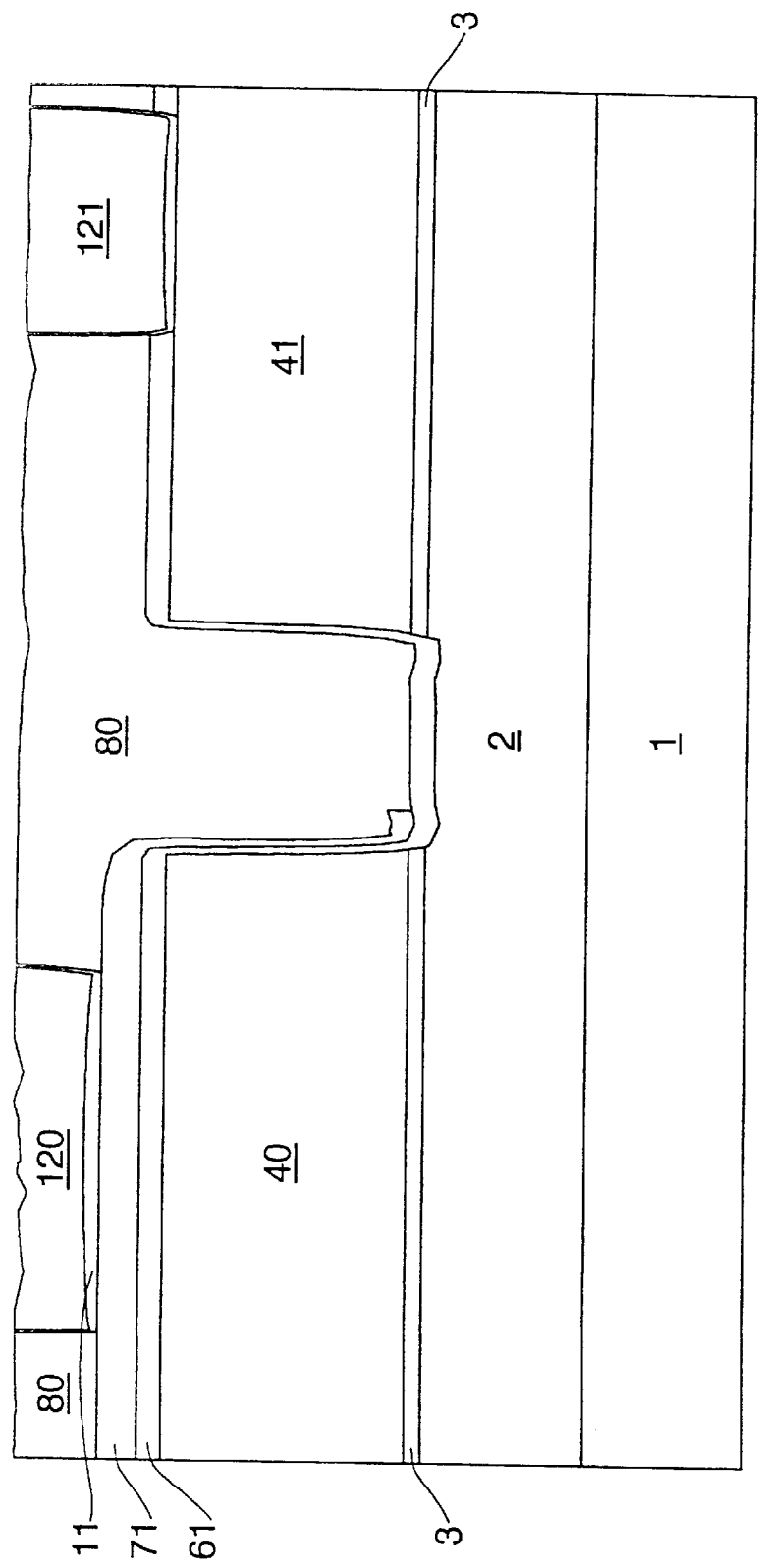
FIG. 9 is a cross-section of an integrated circuit showing the fabrication through the polishing which reveals the two vias according to the present invention.
Figure 10:
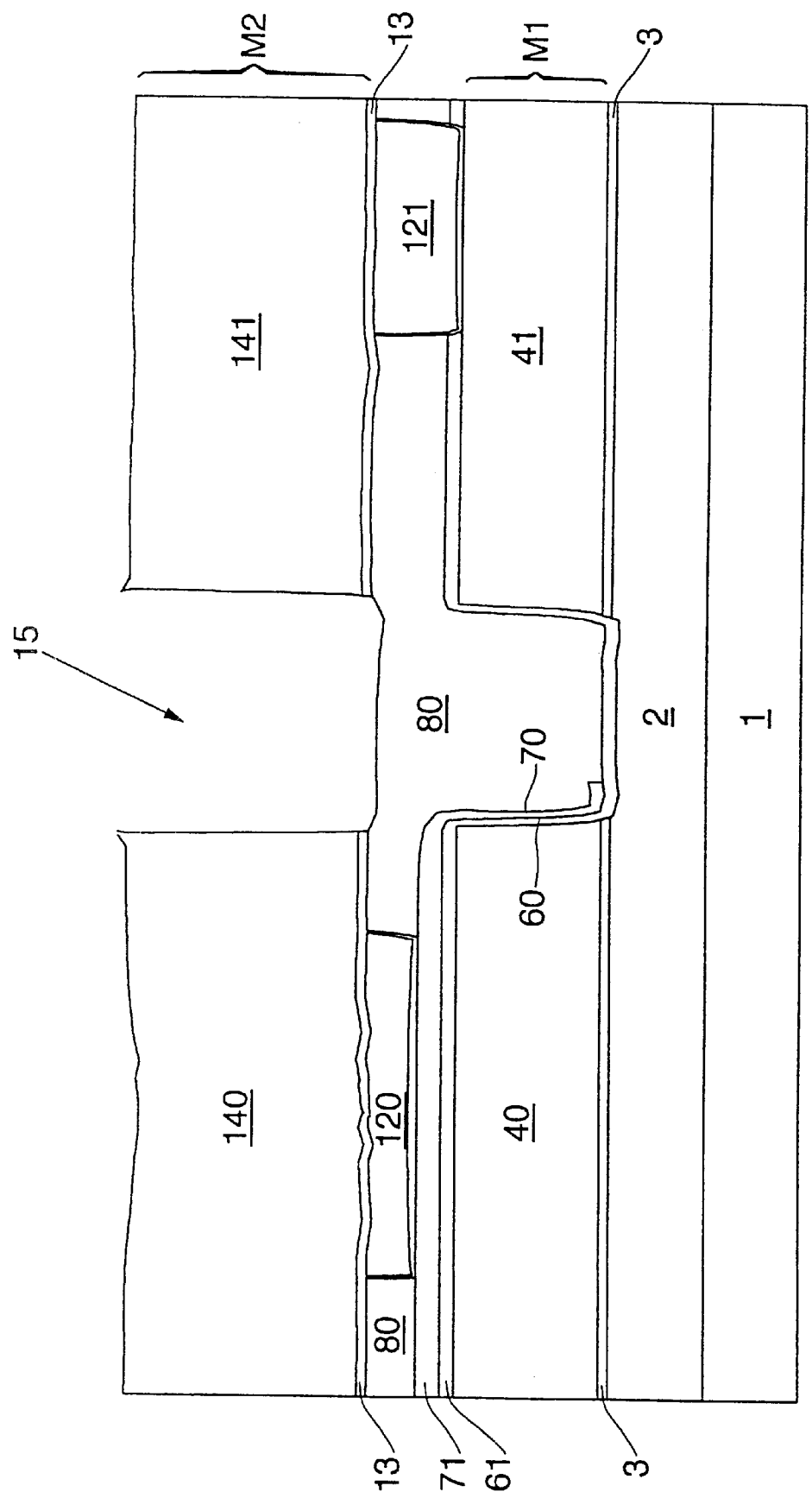
FIG. 10 is a cross-section of an integrated circuit showing the fabrication through the deposit and etching of the metallization level according to the present invention.

After mechanochemically polishing the whole assembly, two metal interconnection holes or vias 120 and 121 are obtained (FIG. 9). The protective layer 11 provides, again, a diffusion barrier in order to prevent interdiffusion between aluminium and tungsten.

Next (FIG. 10), another layer 13 of titanium or titanium nitride is deposited on the whole assembly and then a third metal layer, of aluminium, intended to form the level of metallization M2, is deposited and etched so as, in particular, to form an aperture 15 which separates the part 140 (in contact with the via 120 and consequently with the second metal electrode 71 of the metal-metal capacitor) from the other part 141 (in contact with the via 121). The second metal electrode 71 of the metal-metal capacitor may therefore be connected in this way by means of the metal part 140 of the level of metallization M2 immediately above.

3. General Implementation

The functionality described herein may be embodied in computer readable media such as 3.5 inch diskettes to be used in programming an information-processing apparatus to perform in accordance with the invention. This functionality may also be embodied in computer readable media such as a transmitted waveform to be used in transmitting the information or functionality.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A process for fabricating a metal-metal capacitor within an integrated circuit, the integrated circuit comprising a lower insulating layer, a first metal layer which is on top of the lower insulating layer, and an upper insulating layer which is on top of the first metal layer; and the capacitor comprising a first metal electrode, a second metal electrode, and a dielectric layer wherein each of the two metal electrodes is in contact with one side of the dielectric layer, the process comprising the steps of:

depositing the first metal layer on top of the lower insulating layer;

etching the first metal layer so as to form the first metal electrode;

depositing the dielectric layer on top of the etched first metal layer;

producing the second metal electrode on top of the lower insulating layer; and depositing the upper insulating layer on top of the two metal electrodes and the dielectric layer.

2. The process of claim 1, wherein:

the step of producing the second metal electrode on top of the lower insulating layer comprises:

depositing a second metal layer on top of the dielectric layer; and etching the second metal layer in order to form the second metal electrode, the second metal layer being etched after the etching of the first metal layer, and the step of depositing the upper insulating layer on top of the two metal electrodes and the dielectric layer comprises depositing the upper insulating layer on top of the etched second metal layer.

3. The process of claim 2, wherein:

the step of depositing the dielectric layer on top of the etched first metal layer comprises depositing the dielectric layer directly on top of the etched first metal layer; and the step of depositing a second metal layer on top of the dielectric layer comprises depositing a second metal layer directly on top of the dielectric layer.

4. The process of claim 2, wherein:

the step of etching the first metal layer so as to form the first metal electrode comprises making at least one side wall;

the step of depositing the dielectric layer on top of the etched first metal layer comprises depositing the dielectric layer on top of the at least one side wall; and the step of etching the second metal layer in order to form the second metal electrode comprises etching the second metal layer such that the second metal layer comprises a side portion in contact with the dielectric layer and facing the at least one side wall.

5. The process of claim 1, further comprising the steps of:

etching the upper insulating layer so as to produce an aperture in the upper insulating layer;

filling the aperture in the upper insulating layer with a filling metal so as to form a metal interconnection hole; and depositing a third metal layer on top of the upper insulating layer and on top of the metal interconnection hole.

6. The process of claim 1, wherein the second metal layer is substantially thinner than the first metal layer.

7. The process of claim 1, wherein the thickness of the second metal layer is less than ½ of the thickness of the first metal layer.

8. The process of claim 1, wherein the first metal layer has a thickness of at least 0.4 microns and the second metal layer has a thickness of less than 0.3 microns.

9. A process for fabricating a metal-metal capacitor within an integrated circuit, the integrated circuit comprising a lower insulating layer, a first metal layer which is on top of the lower insulating layer, and an upper insulating layer which is on top of the first metal layer; and the capacitor comprising a first metal electrode, a second metal electrode, and a dielectric layer wherein each of the two metal electrodes is in contact with one side of the dielectric layer, the process comprising the steps of:

producing the two metal electrodes and the dielectric layer on top of the lower insulating layer, the dielectric layer having an upper surface and a lower surface, the first metal electrode contacting only the lower surface of the dielectric layer and the second metal electrode contacting only the upper surface of the dielectric layer; and depositing the upper insulating layer on top of the two metal electrodes and the dielectric layer.

10. The process of claim 9, wherein the step of producing the two metal electrodes and the dielectric layer comprises:

depositing the first metal layer on top of the lower insulating layer;

etching the first metal layer so as to form the first metal electrode; and depositing the dielectric layer on top of the etched first metal layer.

11. The process of claim 9, wherein the producing step comprises:

forming the first metal electrode with at least one side wall;

depositing the dielectric layer on top of the at least one side wall; and forming the second metal electrode with a side portion that is in contact with the dielectric layer and faces the at least one side wall.

12. A process for fabricating a metal-metal capacitor within an integrated circuit, the integrated circuit comprising a lower insulating layer, a first metal layer which is on top of the lower insulating layer, and an upper insulating layer which is on top of the first metal layer; and the capacitor comprising a first metal electrode, a second metal electrode, and a dielectric layer wherein each of the two metal electrodes is in contact with one side of the dielectric layer, the process comprising the steps of:

producing the two metal electrodes and the dielectric layer on top of the lower insulating layer, the first metal electrode having at least one side wall and at least part of the dielectric layer being in contact with the side wall of the first metal electrode; and depositing the upper insulating layer on top of the two metal electrodes and the dielectric layer.

13. The process of claim 12, wherein the producing step comprises forming the second metal electrode with a side portion that is in contact with the dielectric layer and faces the at least one side wall.

14. The process of claim 12, wherein the step of producing the two metal electrodes and the dielectric layer comprises:

depositing the first metal layer on top of the lower insulating layer;

etching the first metal layer so as to form the first metal electrode; and depositing the dielectric layer on top of the etched first metal layer.

* * * * *